(12) United States Patent
Kawamura et al.

(10) Patent No.: US 6,303,987 B1
(45) Date of Patent: Oct. 16, 2001

(54) COMPRESSION BONDED TYPE SEMICONDUCTOR DEVICE

(75) Inventors: Toshinobu Kawamura; Katsumi Satoh, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/664,574

(22) Filed: Sep. 18, 2000

Related U.S. Application Data

(63) Continuation of application No. PCT/JP99/00120, filed on Jan. 18, 1999.

(51) Int. Cl.[7] ................................................. H01L 23/02
(52) U.S. Cl. .......................... 257/686; 257/181; 257/688; 257/689
(58) Field of Search .................................. 257/181, 182, 257/127, 138, 172, 173, 178, 179, 180, 686, 688

(56) References Cited

U.S. PATENT DOCUMENTS

| | | | | |
|---|---|---|---|---|
| 4,389,662 | * | 6/1983 | Miyajima | 343/771 |
| 5,121,189 | * | 6/1992 | Niwayama | 257/688 |
| 5,278,434 | * | 1/1994 | Niwayama | 257/181 |
| 5,489,802 | * | 2/1996 | Sakamoto et al. | 257/688 |
| 5,543,363 | * | 8/1996 | Tokunoh et al. | 438/118 |
| 5,621,237 | * | 4/1997 | Konishi et al. | 257/433 |
| 5,777,351 | | 7/1998 | Taguchi et al. | |

FOREIGN PATENT DOCUMENTS

| | | |
|---|---|---|
| 62-32555 | 2/1987 | (JP) . |
| 10-270475 | 10/1998 | (JP) . |

* cited by examiner

*Primary Examiner*—Nathan Flynn
*Assistant Examiner*—Leonardo Andújar
(74) *Attorney, Agent, or Firm*—Oblon, Spivak, McClelland, Maier & Neustadt, P.C.

(57) ABSTRACT

A compression bonded type semiconductor device including a semiconductor substrate having a top surface and a bottom surface a gate electrode and a cathode electrode formed on the top surface of said substrate, and an anode electrode formed on the bottom surface of said substrate. Also included is an insulating cylinder accommodating the semiconductor substrate, a ring gate electrode contacting said gate electrode, and an external gate terminal having an outer periphery projecting from a lateral side of said insulating cylinder and being rigidly attached thereto, and having an inner periphery contacting said ring gate electrode. Further included is a control gate electrode configured to be electrically connected to said external gate terminal and an external control apparatus, a support member concentrically disposed with respect to the external gate terminal and having an elastic body configured to press together the external gate terminal and the control gate electrode, and a stack electrode configured to compress the compression bonded type semiconductor element and to support the support member.

28 Claims, 5 Drawing Sheets

COMPRESSION BONDED TYPE SEMICONDUCTOR DEVICE

CROSS-REFERENCE TO THE RELATED APPLICATION

This application is a continuation of international application PCT/JP99/00120, filed on Jan. 18, 1999, the entire contents of which are incorporated by reference.

BACKGROUND OF THE INVENTION

1. Field of the Invention

This invention generally relates to a compression bonded type semiconductor device for use in power conversion devices including, but not limited to, gate commutated turn-off (GCT) thyristors.

2. Description of the Background

Gate turn-off (GTO) thyristors have been widely used in large-capacity power electronics. However, background GTO thyristors have the following problem. First, snubber circuitry is required, and second, it is difficult to suppress an increase in snubber loss which occurs with an increase in operation voltages thereof. Fortunately, a specific thyristor device, known as a gate commutated turn-off (GCT) thyristor (which is designed to eliminate the use of this snubber circuitry) has been developed, thereby making it possible to achieve enhanced performance. The GCT has a maximum cut-off current of 6,000A, and a turn-off accumulation time of less than or equal to 3 microseconds ($\mu s$).

FIG. 6 is a cross-sectional view of a background compression bonded type semiconductor disclosed in Published Japanese Patent Application No. 8-330572 (1996), and which is designed to include a GCT and its associative gate drive device for controlling the GCT. As shown, a GCT 1 includes a semiconductor substrate 2. An aluminum gate electrode 2a is formed at an outer periphery on a top surface of the substrate 2, and a cathode electrode 2b is formed on an inner periphery of the top surface of the substrate. In addition, an anode electrode 2c is formed on a bottom surface of the substrate 2. A cathode distortion buffer disk 3 and an external cathode electrode 4 are sequentially stacked over each other on the side of the cathode electrode 2b. An anode distortion buffer disk 5 and an external anode electrode 6 are sequentially stacked on a side of the anode electrode 2c. In addition, the GCT 1 includes a ring gate electrode 7 made of molybdenum, which is in contact with the gate electrode 2a of the semiconductor substrate 2, and a ring-shaped external gate terminal 8 made of either iron or nickel alloy.

An inner periphery of the external gate terminal 8 contacts the ring gate electrode 7 and an outer periphery externally projects from a lateral side of an insulating cylinder 14. Further, curved portions 8a of the external gate terminal 8 are formed inside and outside of the insulating cylinder 14, and a specified number of attachment holes 8c (for example, twenty-four for a GCT of 6 kV/6 kA rating) are formed in connection portions 8b. The attachment holes 8c are for connecting the external gate terminal 8 to a plate-shaped control gate electrode 18 at equally spaced positions of a concentric pattern.

The GCT 1 also includes an elastic body 9, which presses the ring gate electrode 7 against the gate electrode 2a along with the external gate terminal 8 in cooperation with an annular insulator 10. Also provided are an insulator 11, a first flange 12 rigidly secured to the external cathode electrode 4 and a second flange 13 fixed to the external anode electrode 6. The insulating cylinder 14 is divided into upper and lower portions, and has an outer periphery that projects externally from a lateral side thereof and is rigidly attached by soldering at a divider section 14a. In addition, end portions 15 are soldered to the insulating cylinder 14 and then secured to the first flange 12 and second flange 13, thereby sealing the GCT 1.

In addition, a stack electrode 16 applies pressure to the GCT 1 and also takes out a current while simultaneously releasing heat from the external cathode electrode 4 and external anode electrode 6. A plate-shaped control electrode 17 includes an annular metal plate and is disposed concentrically with respect to the external gate terminal 8. A plate-shaped control gate electrode 18 includes an annular metal plate disposed concentrically with the external gate terminal 8 and is electrically connected to an outer periphery of the external gate terminal 8 at its inner periphery thereof. An insulation sleeve 19 electrically isolates the plate-shaped control electrode 17 and the plate-shaped control gate electrode 18, and is secured by fasteners 20. The plate-shaped control electrode 17 and plate-shaped control gate electrode 18 are connected with a gate drive device 21, which controls the GCT 1. A holding plate 23, such as a washer, functions as a distortion correction plate that firmly retains the connection portions 8b between the outer periphery of the external gate terminal 8 and the inner periphery of the plate-shaped control gate electrode 18 by use of fasteners 24 at each of the attachment holes 8c. Eighteen connection portions 8b may be provided for a 6 kV/4 kA-rated GCT (outer size is approximately 147 mm). Alternatively, twenty-four connection portions 8b may be used for a 6 kV/6 kA-rated GCT (outer size is about 200 mm).

An operation of the GCT 1 will now be explained. When the GCT 1 is turned on, a gate current is isotropically supplied from the gate drive device 21 to the external gate terminal 8 so the current is fed from the entire periphery thereof. Thus, a main current flows from the external anode electrode 6 toward the external cathode electrode 4. Alternatively, when the GCT 1 is turned off, a gate current of the reverse direction is supplied, thus rapidly extinguishing the main current. A current fall-down gradient of such a reverse gate current is set at approximately 6,000 A/$\mu s$. This value setting makes it possible to increase the switching rate in cooperation with a rise-up gradient in the turn-on event at about 1,000 A/$\mu s$.

However, the above-discussed background GCT 1 has the following problems.

As the maximum cutoff current increases, an increase in capacity of the GCT results in an increase in a number of segments that are concentrically parallel-connected on the surface of the semiconductor substrate 2. Thus further leads to an increase in a diameter of the semiconductor substrate 2 and a diameter of the package structure. In addition, the greater the outer diameter, the greater the number of attachment holes are required.

During product test/inspection procedures of the GCT 1, when the gate drive device 21 is limited in number, product test/inspection processes require repeated exchanges of the GCT 1. This requires time-consuming processes including complete attachment or detachment of the fasteners 24 to fix the attachment sections 8b. For example, in the product test procedure (turn-on test and turn-off test by pulse test/inspection techniques at high temperatures or low temperatures) of a GCT 1 of 6 kV/6 kA ratings, at least three processes of attachment and detachment of twenty-four different clamping parts is required. Even more complex processes and time consumption will be required with a further increased capacity of the GCT.

In addition, the holding plate 23 is designed to function as a distortion corrector plate to retain the contact between the outer periphery of the external gate terminal 8 and the inner periphery of plate-shaped control gate electrode 18. However, when the holding plate 23 has a relatively small thickness, the resulting pressure near or around a fixation portion of the fasteners 24 tends to become stronger. Thus, a close contact is achieved only at very limited portions adjacent to the fixation part in the connection portions 8b. This results in point-to-point or "pin-point" contact. Due to the lack of area contact, it is impossible to take full advantage of the GCT 1's inherent performance, such as an ability to supply a uniform gate current to the external gate terminal 8. This causes a serious problem in which the current locally concentrates which can permanently damage the GCT 1.

In addition, the increase of the switching speed or rate of the GCT 1 has widened the application field of large current controllability in certain operating frequency ranges exceeding 1 kHz, for example, especially where the external gate terminal 10 is made of specific ferromagnetic materials including iron or nickel. However, variations of magnetic fluxes induced by a recurrent phase inversion of a gate current can cause induction heat-up activities due to the electromagnetic induction, which results in an increase in temperature of the external gate terminal 8. Further, it is difficult to directly cool the external gate terminal 8 because of the component shape and layout, irrespective of the material of the external gate terminal 8.

The trend of further increasing the device capacity by increasing the maximal cut-off current of the GCT 1 also causes increases in the temperature of the gate electrode 2a. In contrast to the cathode electrode 2b and anode electrode 2c that are effectively cooled down, the cooling of the gate electrode 2a at the edge portion of the semiconductor substrate 2 is insufficient which results in along-the-surface temperature distribution of the semiconductor substrate 2 becoming non-uniform, causing the characteristics of the GCT 1 to change.

SUMMARY OF THE INVENTION

Accordingly, one object of the present invention is to solve the above-noted and other problems.

Yet another object of the present invention is to provide a novel compression bonded type semiconductor device which is easy to attach and detach from a gate drive device.

Still another object of the present invention is to provide a novel compression bonded type semiconductor device which prevents an occurrence of a point-to-point contact at a connection portion used for connecting the outer periphery of an external gate terminal and the inner periphery of a plate-shaped control gate electrode.

Another object of the present invention to provide a novel compression bonded type semiconductor device which suppresses non-uniformity of an along-the-surface temperature distribution of the semiconductor substrate of a GCT.

To achieve the above-noted and other objects, the present invention provides a novel compression bonded type semiconductor element including a semiconductor substrate having a top surface and a bottom surface, a gate electrode along with a cathode electrode formed on the top surface of the substrate, an anode electrode formed on the bottom surface of the substrate, and an insulating cylinder accommodating the semiconductor substrate. Also included is a ring gate electrode in contact with the gate electrode, and an external gate terminal having an outer periphery projecting from a lateral side of the insulating cylinder and being rigidly attached thereto and having an inner periphery contacting with the ring gate electrode. A control gate electrode is also provided which is connectable to an external control apparatus electrically connected to the external gate terminal. A support member is also provided, which is disposed concentrically with respect to the external gate terminal, and which has an elastic body for pressing a connection portion to electrically connect the external gate terminal and the plate-shaped control gate electrode. A stack electrode also compresses the compression bonded type semiconductor element while supporting the support member.

The support member disposed concentrically with the external gate terminal presses the connection portion at which the external gate terminal is electrically connected to the plate-shaped control gate electrode. The stack electrode also supports the support member. Thus, the support member causes the external gate terminal to be in tight contact with the plate-shaped control gate electrode. Therefore, it is possible to eliminate the use of the attachment holes and fasteners for securing the external gate terminal to the plate-shaped control gate electrode. This makes it possible to facilitate attachment or detachment of the GCT to the plate-shaped control gate electrode.

Further, according to the present invention, the elastic body may have a loop shape. In this instance, it is possible to uniformly press the connection portion between the outer periphery of the external gate terminal and the inner periphery of the plate-shaped control gate electrode. This prevents the contact of such connection portion from being a point-to-point contact while at the same time eliminating local concentration of a current flowing therein.

In addition, the support member may also be provided with a heat release mechanism. Then it is possible to efficiently cool any heat generated from a gate electrode section via the ring gate electrode and external gate electrode. Therefore, the non-uniformity of the along-the-surface temperature distribution of the semiconductor substrate of the GCT is suppressed.

The heat release mechanism may include water-cooling schemes. With water-cooling schemes, it is possible to efficiently cool the gate electrode section via the ring-gate electrode and external gate electrode, which suppresses the non-uniformity of the along-the-surface temperature distribution of the semiconductor substrate of the GCT.

The present invention also provides a compression bonded type semiconductor element including a round disk-like shape semiconductor substrate having a top surface and a bottom surface, a gate electrode formed at an outer periphery of the substrates'top surface, a cathode electrode formed inside of the gate electrode, and an anode electrode formed on the substrates'bottom surface. Also included is an external cathode electrode disposed so as to be contacted by pressure with the cathode electrode, an external anode electrode disposed so as to be contacted by pressure with the anode electrode, and an insulating cylinder receiving therein the semiconductor substrate. Further included is a ring gate electrode having a loop shape and which contacts the gate electrode, and an external gate terminal comprising an annular plate projecting from a lateral side of the insulating cylinder and being rigidly attached thereto while having its inner periphery contacting the ring gate electrode.

In addition, a gate drive device is provided to control a gate current. The gate drive device includes a plate-shaped control electrode disposed concentrically with the external gate terminal and is electrically connected to the external cathode electrode. The gate drive device also includes a plate-shaped control gate electrode disposed concentrically with the external gate terminal and is electrically connected at its inner periphery to the external gate terminal. The plate-shaped control electrode and the plate-shaped control gate electrode are secured via a first insulating body. A stack electrode is also provided which includes a first stack electrode for compressing the compression bonded type semiconductor element from the external cathode electrode, and a second stack electrode for compressing the compression bonded type semiconductor element from a side of the external anode electrode. The second stack electrode extends to a location underlying a connection portion permitting electrical connection between the external gate terminal and the plate-shaped control gate electrode.

In addition, a loop-shaped support member is disposed concentrically with the external gate terminal between the second stack electrode and the connection portion permitting electrical connection between the external gate terminal and the plate-shaped control gate electrode. The support member has a resilient body for pressing the connection portion and a second insulating body for electrical insulating the second stack electrode and the external gate terminal.

The support member serves to press the external gate terminal against the plate-shaped control gate electrode, thus making it possible to eliminate the use of attachment holes and fasteners for fixing the external gate terminal to the plate-shaped control gate electrode. This facilitates attachment or detachment of the GCT to the plate-shaped control gate electrode.

Another advantage of the present invention is the loop-shaped elastic body enables uniform compression of the connection portion between the outer periphery of the external gate terminal and the inner periphery of the plate-shaped control gate electrode, which makes it possible to prevent the electrical contact of the connection portion from being a point-to-point contact.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
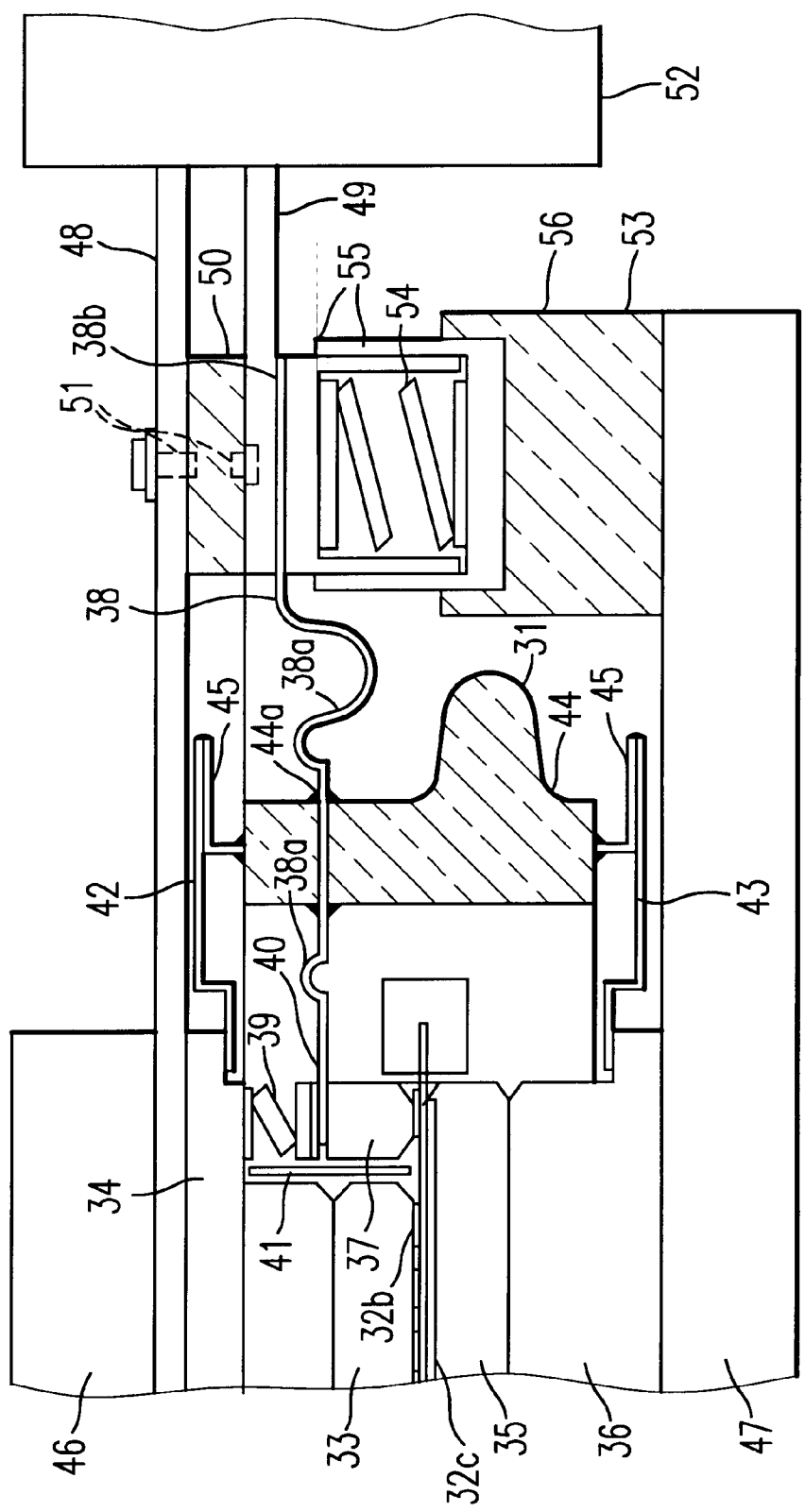
FIG. 1 is a cross-sectional view of a compression bonded type semiconductor device according to a first preferred embodiment of the present invention.

Referring now to the drawings, wherein like reference numerals designate identical or corresponding parts throughout the several views, the first and second preferred embodiments of the present invention will be described.

First Preferred Embodiment

FIG. 1 is a cross-sectional view of compression bonded type semiconductor device GCT 31 and a gate drive device 52 for controlling the GCT 31. As shown, a round disk-shaped semiconductor substrate 32 has an outer peripheral portion at which a gate electrode 32a made of aluminum is formed, a cathode electrode 32b made of aluminum formed inside of the gate electrode 32a, and an anode electrode 32c made of aluminum formed on the back surface of the substrate 32. A cathode distortion buffer disk 33 made of molybdenum and an external cathode electrode 34 made of copper are sequentially mounted on the side of the cathode electrode 32b, and an anode distortion buffer disk 35 made of molybdenum and an external anode electrode 36 made of copper are sequentially mounted on the side of the anode electrode 32c.

A ring gate electrode 37 containing copper, molybdenum, stainless or other similar suitable materials as its main component is in contact with the gate electrode 32a. An external gate terminal 38 includes an annular plate of a chosen nonmagnetic material, which contains as its main component a specific material that hardly receives any electromagnetic induction (e.g., copper molybdenum, tungsten, or an alloy thereof, or phosphor bronze, etc.). The external gate terminal 38 has an inner periphery in contact with the ring gate electrode 37 and an outer periphery externally projecting from a lateral side of a insulating cylinder 44. The external gate terminal 38 also has curved portions 38a formed at certain locations inside and outside of the insulating cylinder 44, and it is electrically connected by a plate-shaped control gate electrode 49 and connection portion 38b. An elastic body 39 (e.g., a plate spring or wave spring) presses the ring gate electrode 37 against the gate electrode 32a via an annular insulator 40 together with the external gate terminal 38.

An insulator 41 formed of an electrically insulating sheet made of polyimide or the like is provided between the ring gate electrode 37 and external gate terminal 38 on the one hand, and the cathode distortion buffer disk 33 and the external cathode electrode 34 on the other hand. A first flange 42 made of iron or nickel, etc. is rigidly secured to the external cathode electrode 34, and a second flange 43 made of iron or nickel or the like is rigidly secured to the external anode electrode 36. The insulating cylinder 44 is made of ceramics or the like and is subdivided into upper and lower portions. The outer periphery of the external gate terminal 38 projects toward the outside from the lateral side of the insulating cylinder 44 and is rigidly secured by a dividing portion 44a. In addition, each terminate end 45 fixed to the insulating cylinder 44 is then rigidly attached to the first flange 42 and second flange 43, thereby permitting the GCT 31 to have an enclosure-sealed structure.

In addition, a first stack electrode 46 compresses the GCT 31 via the external cathode electrode 34. A second stack electrode 47 compresses the GCT 31 from a side of the external anode electrode 36 and is arranged to extend up to a location underlying the connection portion 38b, where the external gate terminal 38 is electrically connected to a plate-shaped control gate electrode 49. A stack electrode including essentially the first stack electrode 46 and second stack electrode 47 compresses the GCT 31 for stable settlement and also takes out a current while simultaneously permitting an external release of heat generated from the external cathode electrode 34 and external anode electrode 36.

A plate-shaped control electrode 48 including an annular metal plate is disposed concentrically with respect to the external gate terminal 38 and is compressed by the first stack electrode 46 to the external cathode electrode 34. A plate-shaped control gate electrode 49 including an annular metal plate is disposed concentrically relative to the external gate terminal 38 and is electrically connected at its inner periphery to the outer periphery of the external gate terminal 38. An insulation sleeve 50 for electrically insulating the plate-shaped control electrode 48 and the plate-shaped control gate electrode 49 is rigidly engaged by fastening components 51 (e.g., bolts) to the plate-shaped control electrode 48 and plate-shaped control gate electrode 49. In addition, the control and gate electrodes 48, 49 are connected to the gate drive device 52, which controls the GCT 31.

Further, a support member 53 having an annular shape is disposed concentrically with the external gate terminal 38 between the connection portion 38b and the second stack electrode 47 (where the external gate terminal 38 and the plate-shaped control gate electrode 49 are electrically connected together) for pressing the connection portion 38b. The support member 53 accommodates an elastic body 54 including a plate spring or wave spring having an annular shape. The support member 53 also includes a gate terminal holding plate 55 made of a chosen metal, and which includes an annular shape for pressing the connection portion 38b. Also included is a second insulator 56 formed in an annular shape provided between the second stack electrode 47 and the gate terminal holding plate 55 for electrically insulating the second stack electrode 47 and gate terminal holding plate 55.

An operation of the device will now be given. When the GCT 31 is turned on, a gate current is isotropically supplied from the gate drive device 52 to the external gate electrode 38 such that the current is fed from the entire periphery thereof, thus igniting a main current that flows from the external anode electrode 36 to the external cathode electrode 34. Alternatively, when the GCT 2 is turned off, a gate current of the reverse direction is supplied so as to rapidly extinguish the main current. A current fall-down gradient of such a reverse gate current is set at approximately 6,000 A/μs, thereby making it possible to increase the switching rate in cooperation with the rise-up gradient in the turn-on event at about 1,000 A/μs.

To enable a large current to flow in the turn-on or turn-off event in this way, the electrical contact of the connection portion 38b must be sufficiently performed. The connection portion 38b connects the external gate electrode 38 and the plate-shaped control gate electrode 49, and forms part of a current flow path leading to the plate-shaped control gate electrode 49 from the external cathode electrode 34.

According to the first embodiment, the support member 53 and the elastic body 54 press the connection portion 38b, and the second stack electrode 47 extends beneath the connection portion 38b for a concentric layout relative to the external gate terminal 38 between the connection portion 38b and the second stack electrode 47. With the support member 53 pressing the connection portion 38b, it is possible to eliminate clamping parts to rigidly fix the external gate terminal 38 to the plate-shaped control gate electrode 49 as is required in the background art (for example, in a GCT of 6 kV/6 kA in rating, attachment holes 8c, keep plates 23, and clamping fasteners 24 at twenty-four different locations). This makes it possible to easily attach and detach the GCT to the plate-shaped control gate electrode.

Further, the elastic body 54 has an annular shape. With such a design, it is possible to uniformly press the connection portion 38b between the outer periphery of the external gate terminal 38 and the inner periphery of the plate-shaped control gate electrode 49. This makes it possible to prevent the connection portion 38b from being a point-to-point or "pin point" contact, while at the same time eliminating or at least greatly suppressing an occurrence of permanent destruction of the GCT due to a local concentration of a current flow.

Furthermore, it is possible to suppress an abnormal heat-up of the external gate terminal 38 due to electromagnetic induction received locally from magnetic fields of external circuitry operatively associated therewith during high-frequency operations, because the external gate terminal is made of non-magnetic materials.

In addition, the gate terminal holding plate 55 enclosing the elastic body 54 and the second insulator 56 may be modified so the positional relationship thereof is reversed in the up-down direction while offering the similar or same functions and advantages as those discussed above.

Still further, the first stack electrode 46 may alternatively be modified to extend to the connection portion 38b in a manner similar to the second stack electrode 47. Even in this case, similar results are obtainable.

In addition, the gate drive device may be any external control apparatus or equipment as long as it offers the intended gate current controllability. Additionally, the control gate electrode connectable to this external control device may be designed to have any appropriate shape other than the described plate-shape.

Figure 2A:
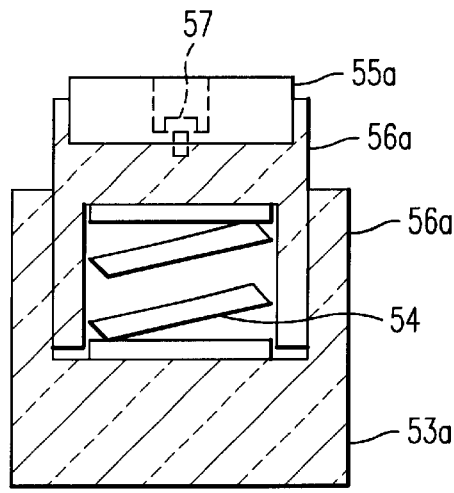
FIGS. 2A–2C are cross-sectional views illustrating various support members according to the present invention.
Figure 2B:
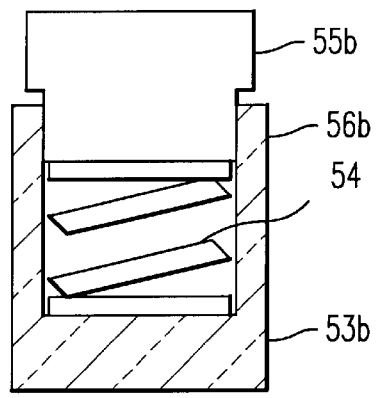
Figure 2C:
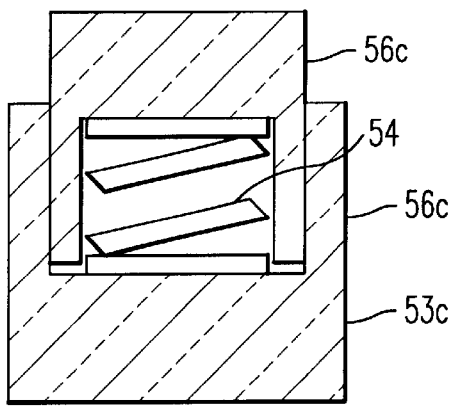

FIGS. 2A–2C illustrate possible modifications of the support member 53. For example, FIG. 2A illustrates a support member 53a having an annular shape, which is provided between the connection portion 38b and the second stack electrode 47 so it is disposed concentrically with respect to the external gate terminal 38 so as to press the connection portion 38b. The support member 53a includes a gate terminal holding plate 55a which contacts the external gate terminal 18. The holding plate 55a includes a metal plate and has an annular shape. The support member 53a also includes an annular-shaped second insulator 56a for electrically isolating the second stack electrode 47 and the gate terminal holding plate 55a and to accommodate the elastic body 54. Further, the second insulator 56a is arranged to internally accommodate the elastic body 54 from the side of the external gate terminal 38 and also from the side of the second stack electrode 47. The side of the second insulator 56 near the external gate terminal 38 is immovably engaged by the gate terminal holding plate 55a and bolt 57, thereby causing the connection portion 38b to be tightly held or pressed by the compressive force of the second elastic body 54.

FIG. 2B illustrates another annular-shaped support member 53b, which is disposed between the connection portion 38b and the second stack electrode 47 so it is disposed concentrically with the external gate terminal 38 so as to press the connection portion 38b. The support member 53b essentially includes an annular-shaped gate terminal holding plate 55b made of a metal, and which contacts the external gate terminal 38. Also included is a second insulator 56b provided between the second stack electrode 47 and the gate terminal holding plate 55b so as to accommodate the second elastic body 54. The second insulator 56b is formed to have an annular shape to electrically isolate the second stack electrode 47 and the gate terminal holding plate 55b, whereby the same effects and advantages as those stated previously are attained.

FIG. 2C illustrates yet another annular support member 53c, which is disposed between the connection portion 38b and the second stack electrode 47, and which is placed concentrically with respect to the external gate terminal 38 so as to press the connection portion 38b. The support member 53c includes a second annular-shaped insulator 56c for receiving the second elastic body 54, while the support member 53c is provided between the connection portion 38b and the second stack electrode 46 to electrically insulate the external gate terminal 38 and the second stack electrode 47. This structure offers the same effects and advantages as those stated above.

Figure 3:
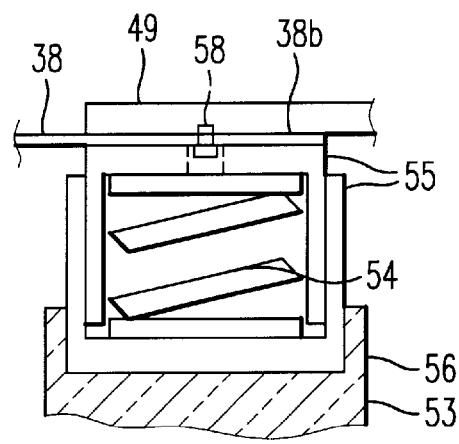
FIG. 3 is a cross-sectional view of another support member according to the present invention.

Further, as shown in FIG. 3, to improve the connectivity of the connection portion 38b between the external gate terminal 38 and the plate-shaped control gate electrode 49, a number of bolts 58 (e.g., 6 bolts at most) may be attached from the side of the gate terminal holding plate 55.

In addition, the gate electrode 32a in the first embodiment is formed at the outer periphery on the surface of the semiconductor substrate 32. However, the gate electrode may be formed at an intermediate part of the substrates'surface, while offering the same effects and advantages as those stated above.

Second Preferred Embodiment

Figure 4:
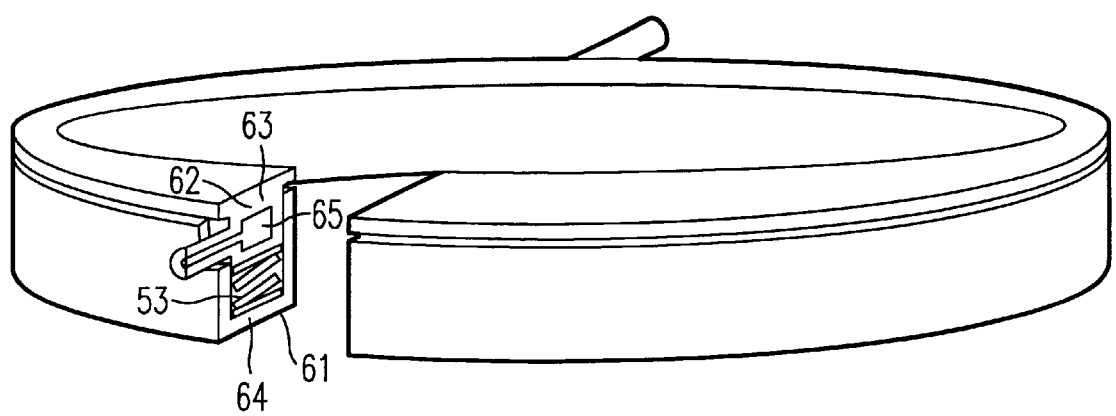
FIG. 4 is a cut-away perspective view of a cross-sectional structure of a support member according to a second preferred embodiment of the present invention.

Turning now to FIG. 4, which illustrates a cut-out perspective view of a compression bonded type semiconductor device according to the second embodiment of the present invention. A difference between the structure shown in FIG. 4 and that of FIG. 1 is the support member includes a heat release mechanism.

In more detail, an annular-shaped support member 61 is provided between the connection portion 38b and the second stack electrode 47, and is disposed concentrically with the external gate terminal 38 to thereby press the connection portion 38b. The support member 61 includes a gate terminal holding plate 63 with a heat release mechanism 62. The heat release mechanism 62 comprises an annular-shaped metal plate including, for example, a metallic material with a chosen soft metal coated on oxygen-free copper. The support member also includes an annular-shaped second elastic body 54 (such as a plate spring or wave spring), and an annular-shaped second insulator 64 provided between the second stack electrode 47 and gate terminal holding plate 63 for receiving the second elastic body 54 and for electrically isolating the second stack electrode 47 and gate terminal holding plate 63. The heat release mechanism 62 is arranged so a ring-shaped water flow passage 65 is provided inside of the gate terminal holding plate 63, thus permitting circulation of a coolant water within the water flow passage 65.

In accordance with the second embodiment, the support member 61 includes the heat release mechanism 62. With such an arrangement, it is possible to allow the heat release mechanism 62 to cool the gate electrode 32a via the ring gate electrode 37 and external gate electrode 38a, which makes it possible to suppress or minimize irregularity or non-uniformity of the along-the-surface temperature distribution of the semiconductor substrate 32.

Further, the heat release mechanism is of the water cooling type. With such an arrangement, it is possible to permit the heat release mechanism 62 to efficiently cool the gate electrode 32a via the ring gate electrode 37 and external gate terminal 38, which makes it possible to suppress any non-uniformity of the along-the-surface temperature distribution of the semiconductor substrate 32.

Figure 5A:
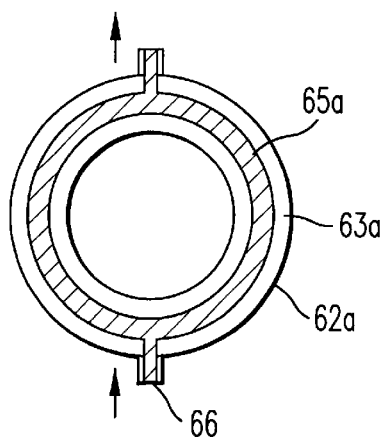
FIGS. 5A–5D are cross-sectional views of a heat release mechanism according to the present invention.

An explanation will now be given of some modifications of the heat release mechanism 62 with reference to FIGS. 5A–5D. FIG. 5A illustrates a modified heat release mechanism 62a which includes a single entrance port and single exit port for the flow of coolant water 66. After the flow of the coolant water 66 is diverted at the entrance, the coolant water 66 flows along inside of a water passage 65a into two sub-flows provided in the gate terminal holding plate 63a, which then meet together at the exit port.

Figure 5B:
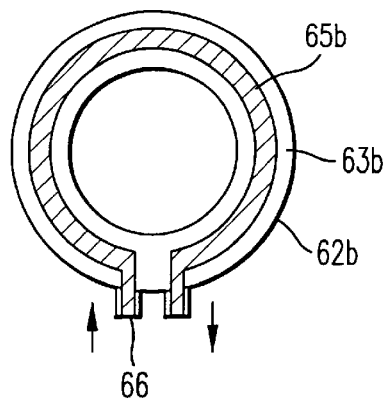

FIG. 5B illustrates another modified heat release mechanism 62b including an entrance port and exit port for letting the flow of coolant water 66 circulate within a water passage 65b provided in a gate terminal holding plate 63b.

Figure 5C:
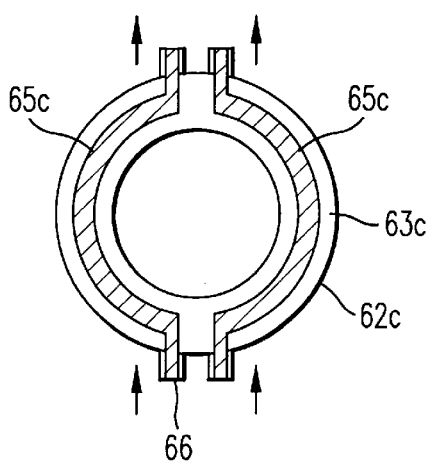

FIG. 5C illustrates yet another modified heat release mechanism 62c which includes two separate entrance and two exit ports to force the flow of coolant water 66 to half circulate in the same direction within the inside space of a substantially half -circled water passage 65c provided in a gate terminal holding plate 63c.

Figure 5D:
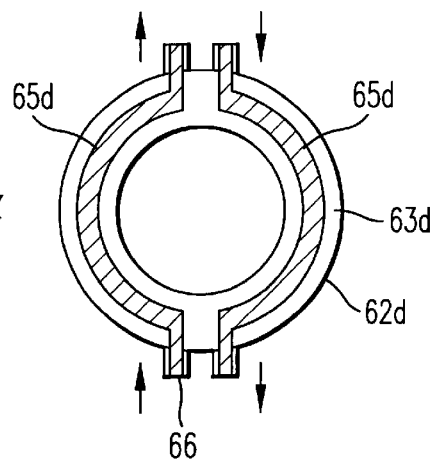
Figure 6:
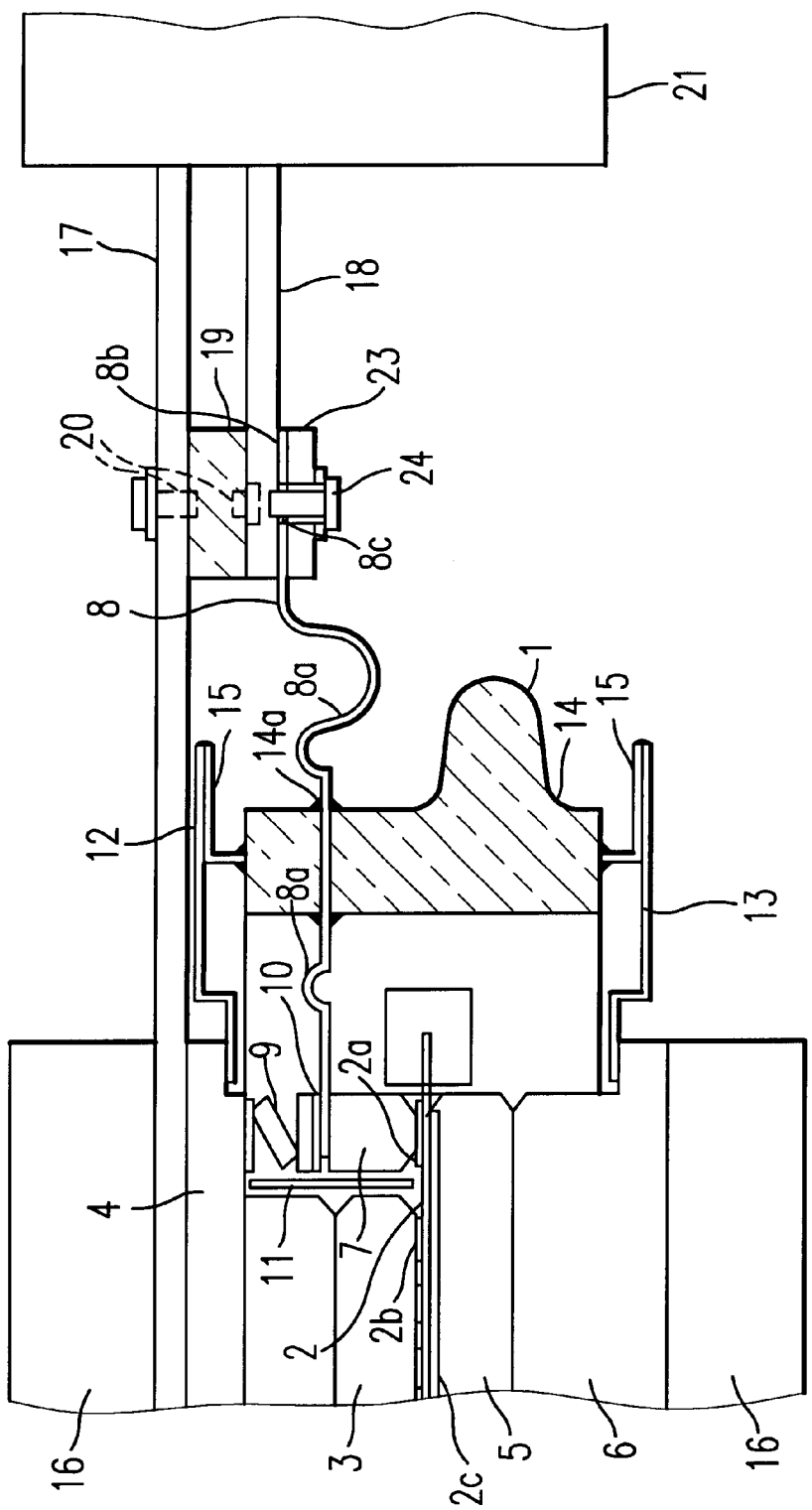
FIG. 6 is a cross-sectional view of a background compression bonded type semiconductor device.

FIG. 5D illustrates another modified heat release mechanism 62d having two entrance and exit ports to force the flow of the coolant water 66 along half-flow passages 65d gate terminal holding plate 63d in the opposite directions relative to each other. With any one of the modifications shown in FIGS. 5A–5D, it is possible to offer the same effects and advantages as those in the second embodiment stated previously.

Obviously, numerous modifications and variations of the present invention are possible in light of the above teachings. It is therefore to be understood that within the scope of the appended claims, the invention may be practiced otherwise than as specifically described herein.

What is claimed is:

1. A compression bonded type semiconductor device, comprising:

a semiconductor substrate having a top surface and a bottom surface;

a gate electrode and a cathode electrode formed on the top surface of said substrate;

an anode electrode formed on the bottom surface of said substrate;

an insulating cylinder accommodating the semiconductor substrate;

a ring gate electrode contacting said gate electrode;

an external gate terminal having a first portion projecting from a lateral side of said insulating cylinder and being rigidly attached thereto, and having a second portion contacting said ring gate electrode;

a control gate electrode configured to be electrically connected to said external gate terminal and an external control apparatus;

a support member concentrically disposed with respect to the external gate terminal and having an elastic body configured to press together the external gate terminal and the control gate electrode; and a stack electrode configured to compress the compression bonded type semiconductor element and to support the support member.

2. The device according to claim 1, wherein the support member further comprises a heat release mechanism configured to cool the gate electrode via the external gate electrode and ring gate electrode.

3. The device according to claim 2, wherein said heat release mechanism comprises a ring-shaped water flow passage configured to cool the gate electrode via the external gate electrode and ring gate electrode.

4. The device according to claim 3, wherein the ring-shaped water flow passage comprises a single entrance port and a single exit port separated from the single entrance port, and configured to divert a water flow at the single entrance port into two sub-flow paths around an inside of the ring-shaped water flow passage and then have the water flow exit via the single exit port.

5. The device according to claim 3, wherein the ring-shaped water flow passage comprises a single entrance port and a single exit port directly adjacent to the single entrance port, and configured to divert a water flow at the single entrance port into a flow path around an inside of the ring-shaped water flow passage and then have the water flow exit via the single exit port.

6. The device according to claim 3, wherein the ring-shaped water flow passage comprises two adjacent entrance ports and two adjacent exit ports separate from the two adjacent entrance ports, and configured to divert a water flow at the two adjacent entrance ports into two respective flow paths around an inside of the ring-shaped water flow passage and then have the water flow exit via the two adjacent exit ports.

7. The device according to claim 3, wherein the ring-shaped water flow passage comprises a first entrance port adjacent to a first exit port and a second entrance port adjacent to a second exit port, and configured to divert a water flow at the first entrance port into a respective flow path around an inside of the ring-shaped water flow passage and then have the water flow exit via the second exit port, and configured to divert a water flow at the second entrance port into a respective flow path around the inside of the ring-shaped water flow passage and then have the water flow exit via the first exit port.

8. The device according to claim 1, wherein the elastic body and the support member comprise an annular shape, and the support member accommodates the elastic body.

9. The device according to claim 1, wherein the support member further comprises a holding plate configured to press against and hold the external gate terminal.

10. The device according to claim 1, wherein the holding plate comprises an annular-shaped metal plate.

11. The device according to claim 9, wherein the holding plate, the external gate terminal and the control gate electrode are secured to each other via fasteners.

12. The device according to claim 1, wherein the semiconductor substrate comprises a round disk-shape.

13. A compression bonded type semiconductor device, comprising:
    a semiconductor substrate having a top surface and a bottom surface;
    a gate electrode formed at an outer periphery of the top surface of the substrate;
    a cathode electrode formed inside of the gate electrode and on the top surface of the substrate;
    an anode electrode formed on the bottom surface of the substrate;
    an external cathode electrode disposed so as to be contacted by pressure with said cathode electrode;
    an external anode electrode disposed so as to be contacted by pressure with said anode electrode;
    an insulating cylinder receiving therein said semiconductor substrate;
    a ring gate electrode contacting said gate electrode;
    an external gate terminal having a first portion projecting from a lateral side of said insulating cylinder and being rigidly attached thereto, and having a second portion contacting said ring gate electrode;
    a gate drive device configured to control a gate current of the semiconductor device, and including a control electrode disposed concentrically with said external gate terminal and being electrically connected to said external cathode electrode, and including a control gate electrode disposed concentrically with said external gate terminal and being electrically connected to said external gate terminal;
    an insulating body configured to connect the control electrode and the control gate electrode;
    a first stack electrode configured to compress said compression bonded type semiconductor element from said external cathode electrode;
    a second stack electrode configured to compress said compression bonded type semiconductor element from a side of said external anode electrode, and extending to a location underlying a connection portion electrically connecting the external gate terminal and the control gate electrode; and
    a support member disposed concentrically with the external gate terminal between the second stack electrode and the connection portion, and having a resilient body configured to press together the external gate terminal and the control gate electrode at the connection portion.

14. The device according to claim 13, wherein the control electrode and the control gate electrode comprise an annular-shaped metal plate.

15. The device according to claim 13, wherein the support member further comprises a heat release mechanism configured to cool the gate electrode via the external gate electrode and ring gate electrode.

16. The device according to claim 15, wherein said heat release mechanism comprises a ring-shaped water flow passage configured to cool the gate electrode via the external gate electrode and ring gate electrode.

17. The device according to claim 15, wherein the ring-shaped water flow passage comprises a single entrance port and a single exit port separated from the single entrance port, and configured to divert a water flow at the single entrance port into two sub-flow paths around an inside of the ring-shaped water flow passage and then have the water flow exit via the single exit port.

18. The device according to claim 15, wherein the ring-shaped water flow passage comprises a single entrance port and a single exit port directly adjacent to the single entrance port, and configured to divert a water flow at the single entrance port into a flow path around an inside of the ring-shaped water flow passage and then have the water flow exit via the single exit port.

19. The device according to claim 15, wherein the ring-shaped water flow passage comprises two adjacent entrance ports and two adjacent exit ports separate from the two adjacent entrance ports, and configured to divert a water flow at the two adjacent entrance ports into two respective flow paths around an inside of the ring-shaped water flow passage and then have the water flow exit via the two adjacent exit ports.

20. The device according to claim 15, wherein the ring-shaped water flow passage comprises a first entrance port adjacent to a first exit port and a second entrance port adjacent to a second exit port, and configured to divert a water flow at the first entrance port into a respective flow path around an inside of the ring-shaped water flow passage and then have the water flow exit via the second exit port, and configured to divert a water flow at the second entrance port into a respective flow path around the inside of the ring-shaped water flow passage and then have the water flow exit via the first exit port.

21. The device according to claim 13, wherein the elastic body and the support member comprise an annular shape, and the support member accommodates the elastic body.

22. The device according to claim 13, wherein the support member further comprises a holding plate configured to press against and hold the external gate terminal.

23. The device according to claim 13, wherein the holding plate comprises an annular-shaped metal plate.

24. The device according to claim 23, wherein the holding plate, the external gate terminal and the control gate electrode are secured to each other via fasteners.

25. The device according to claim 13, wherein the semiconductor substrate comprises a round disk-shape.

26. A compression bonded type semiconductor device, comprising:

- a semiconductor substrate having a top surface and a bottom surface;
- a gate electrode and a cathode electrode formed on the top surface of said substrate;
- an anode electrode formed on the bottom surface of said substrate;
- an insulating cylinder accommodating the semiconductor substrate;
- a ring gate electrode contacting said gate electrode;
- an external gate terminal having a first portion projecting from a lateral side of said insulating cylinder and being rigidly attached thereto, and having a second portion contacting said ring gate electrode;
- means for electrically connecting said external gate terminal and an external control apparatus;
- means for pressing together the external gate terminal and the connecting means; and
- means for compressing the compression bonded type semiconductor element and for supporting the pressing means.

27. The device according to claim 26, further comprising:

means for cooling the gate electrode via the external gate electrode and ring gate electrode.

28. The device according to claim 26, further comprising:

means for compressing said compression bonded type semiconductor element from said external cathode electrode; and means for compressing said compression bonded type semiconductor element from a side of said external anode electrode, and extending to a location underlying a connection portion electrically connecting the external gate terminal and the control gate electrode together the external gate terminal and the control gate electrode at the connection portion.

* * * * *